(12) United States Patent
Hu et al.

(10) Patent No.: US 10,038,089 B2
(45) Date of Patent: Jul. 31, 2018

(54) SGT MOSFET WITH ADJUSTABLE CRSS AND CISS

(71) Applicants: Jun Hu, San Bruno, CA (US); Zhiyun Luo, San Jose, CA (US); Fei Wang, San Jose, CA (US); Mengyu Pan, Shanghai (CN)

(72) Inventors: Jun Hu, San Bruno, CA (US); Zhiyun Luo, San Jose, CA (US); Fei Wang, San Jose, CA (US); Mengyu Pan, Shanghai (CN)

(73) Assignee: HUNTECK SEMICONDUCTOR (SHANGHAI) CO., Ltd, Shanghai (CN)

( * ) Notice: Subject to any disclaimer, the term of this patent is extended or adjusted under 35 U.S.C. 154(b) by 0 days.

(21) Appl. No.: 14/957,570

(22) Filed: Dec. 2, 2015

(65) Prior Publication Data

US 2017/0162689 A1    Jun. 8, 2017

(51) Int. Cl.
| | |
|---|---|
| *H01L 29/66* | (2006.01) |
| *H01L 29/78* | (2006.01) |
| *H01L 21/32* | (2006.01) |
| *H01L 29/10* | (2006.01) |
| *H01L 29/40* | (2006.01) |
| *H01L 21/3213* | (2006.01) |

(52) U.S. Cl.
CPC .... *H01L 29/7813* (2013.01); *H01L 21/32139* (2013.01); *H01L 29/1095* (2013.01); *H01L 29/401* (2013.01); *H01L 29/66734* (2013.01); *H01L 29/7811* (2013.01)

(58) Field of Classification Search
CPC ............... H01L 21/32139; H01L 29/78; H01L 29/7813; H01L 29/1095; H01L 29/401; H01L 29/66734; H01L 29/7811; H01L 21/32; H01L 29/66
See application file for complete search history.

(56) References Cited

U.S. PATENT DOCUMENTS

2013/0001683 A1*  1/2013  Pan ...................... H01L 29/407
                                                                         257/334
2016/0315053 A1* 10/2016  Pan ...................... H01L 29/407

* cited by examiner

*Primary Examiner* — Fazli Erdem
(74) *Attorney, Agent, or Firm* — Bo-In Lin

(57) ABSTRACT

A semiconductor power device includes a plurality of power transistor cells each having a trenched gate disposed in a gate trench opened in a semiconductor substrate wherein a plurality of the trenched gates further include a shielded bottom electrode disposed in a bottom portion of the gate trench electrically insulated from a top gate electrode disposed at a top portion of the gate trench by an inter-electrode insulation layer. At least one of the shielded bottom electrode is connected a source metal and at least one of the top electrodes in the gate trench is connected to a source metal of the power device.

10 Claims, 14 Drawing Sheets

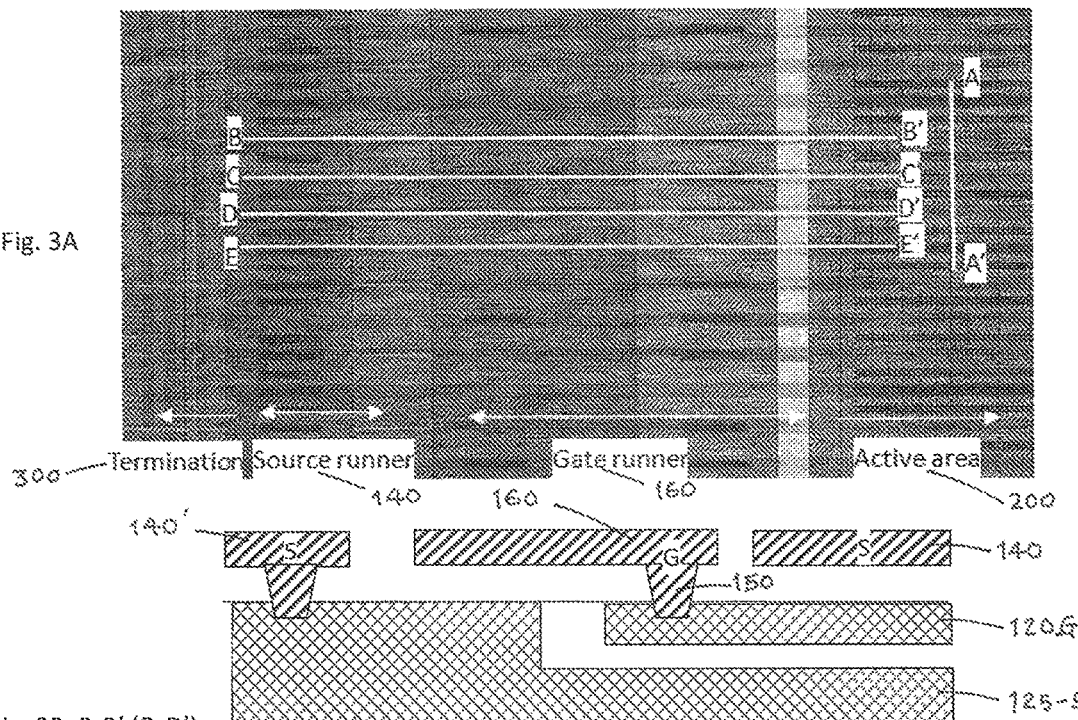
Fig. 3A
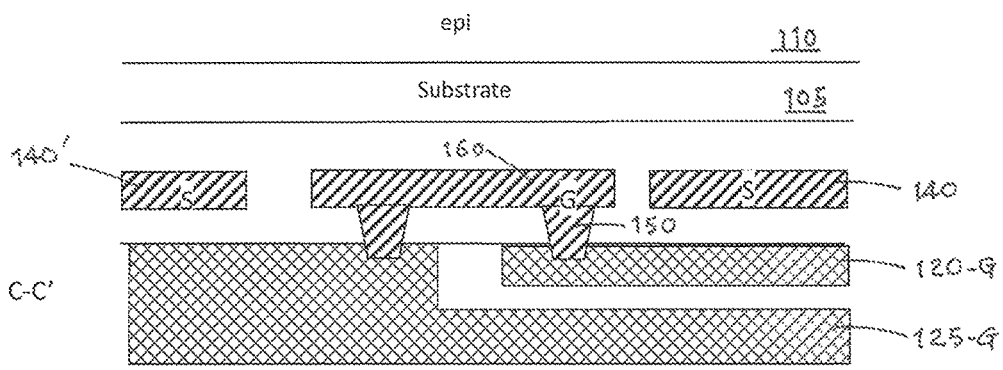
Fig. 3B: B-B' (D-D')
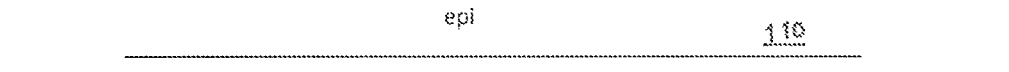
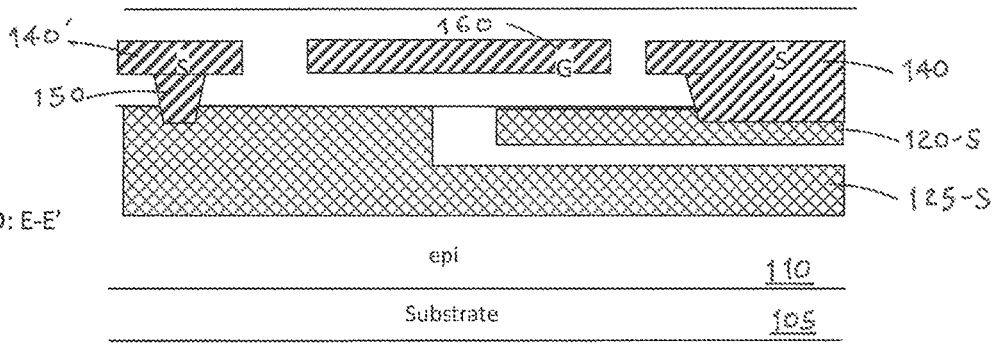
Fig. 3C: C-C'
Fig. 3D: E-E'

Process flow:
Hardmask

Trench etch

Shield oxide deposition

Shield poly deposition

Shield poly recess

Interpoly oxide deposition (HDP, SACVD)

Oxide etch back

Gate oxide

Gate poly deposition and etch back

Body implant and drive in

Source implant and drive in

LTO/ BPSG deposition

Contact and metal deposition

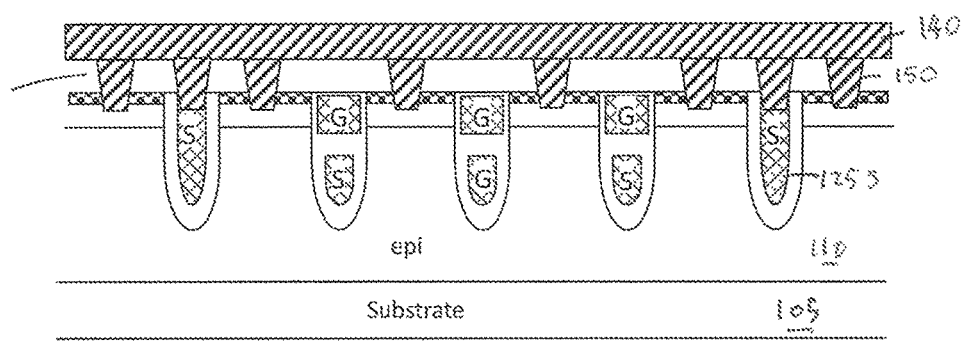
Fig. 8E: A-A'

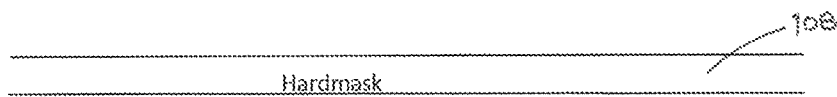
Fig. 9A
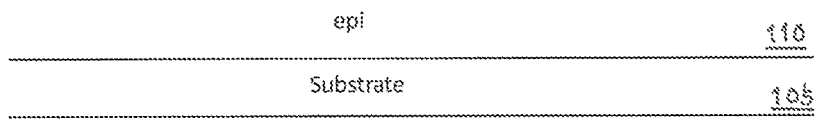
Fig. 9B
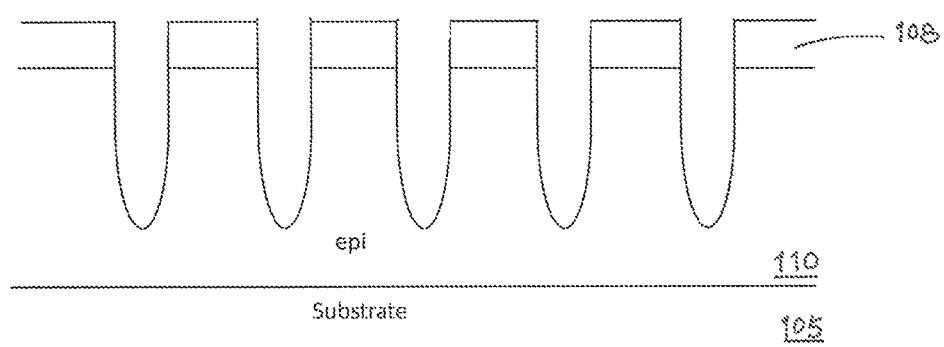
Fig. 9C
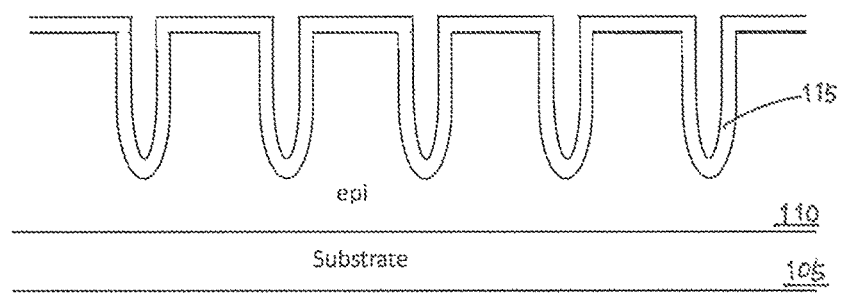
Fig. 9D
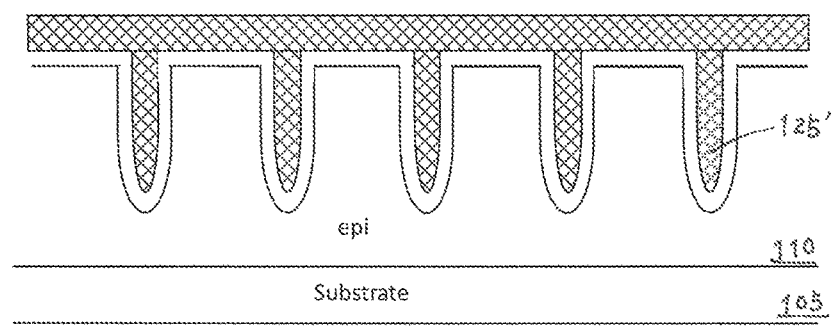

SGT MOSFET WITH ADJUSTABLE CRSS AND CISS

BACKGROUND OF THE INVENTION

1. Field of the Invention

This invention relates generally to structural configurations and manufacturing methods of the semiconductor power devices. More particularly, this invention relates to improved device configurations and manufacturing processes to flexibly adjust device characteristics of Crss and Ciss to smooth the waveforms and to avoid electromagnetic interference (EMI) in the shield gate trench (SGT) MOSFET.

2. Description of the Prior Art

The conventional technologies for reducing the gate to drain capacitance in a power semiconductor device is achieved by implementing a shielded gate trench (SGT) configuration. Comparing with the traditional trench gate MOSFET, the split gate structure has the advantage of lowering CRSS thus achieving much better efficiency. Specifically, a power MOSFET with a lower CRSS has the advantages of high switching speed and a lower loss. However, a power device with a lower CRSS may lead to other technical limitations such as issues caused by high gate ringing, high turning on and turning off VDS spikes, and electromagnetic interference (EMI).

Furthermore, conventional technologies for manufacturing the SGT MOSFET encounter another difficulty due to the requirement of reducing the specific-on resistance in a device that has a high cell density with significantly reduced pitch. The high density configurations with reduced pitch often causes the input capacitance CISS o increase thus slowing down the tuning on and off speeds. Additionally, high CISS also leads to higher switch loss, increased gate charges thus requiring a stronger gate drive. For these reasons, the conventional SGT MOSFET devices are limited by a tradeoff between the needs to reduce the specific-on resistance and the undesirable result of increasing the CISS.

FIG. 1 shows a DMOS cell disclosed by Baliga in U.S. Pat. No. 5,998,833. The conventional configuration as shown in FIG. 1 includes a source electrode placed underneath the trenched gate to reduce the gate-to-drain capacitance. The split gate configuration includes a gate for the DMOS cell divided into two segments. The gate-to-drain capacitance is reduced because the contributions to capacitance from the gate-drain overlapping areas are eliminated.

However, the device as shown in FIG. 1 is directed to a transistor configuration that the bottom electrodes disposed in the bottom of the trenches for the conventional SGT devices are connected to the source voltage. Even the device configuration has the benefits of reduced gate to drain capacitance; however, as discussed above, there are limitations and difficulties with such device configuration.

As there are growing demands for high frequency switch power devices with increase cell density and reduced pitches, an urgent need exists to provide effective solutions to resolve the above-discussed technical difficulties and limitations. New device configurations and manufacturing processes are necessary to make the power transistors including MOSFET and IGBT to overcome the technical difficulties and limitations of these switching power devices.

SUMMARY OF THE PRESENT INVENTION

It is therefore an aspect of the present invention to provide a new and improved semiconductor power device implemented with the shielded gate trench (SGT) structure to flexibly adjust the configuration of the connections of the bottom electrodes. Specifically, some of the bottom-shielding electrodes are connected to the source metal and some of the bottom shielding electrodes connected to the gate metal. The ratio of the numbers of the bottom electrodes that are connected to the source relative to the electrodes that are connected to the gate can be flexibly adjust depending on the applications of the power device in order to reduce the ringing and to avoid the EMI issues in the power devices for the DC-DC applications such that the above discussed difficulties are resolved.

Specifically, one aspect of the present invention is to provide a new and improved manufacturing processes and configurations of the semiconductor power device implemented with the shielded gate trench (SGT) structure that has some of the bottom-shielding electrodes and also the top-shielding electrodes in the SGT connected to the source metal and some of the bottom shielding electrodes connected to the gate metal. The new configuration is implemented to achieve an increased Crss thus accomplishing the goal of ringing reduction.

Another one aspect of the present invention is to provide a new and improved manufacturing processes and configurations of the semiconductor power device implemented with the shielded gate trench (SGT) structure that allows flexibly adjustable connections of the bottom electrodes in the SGT to connect to the source metal and to the gate metal. By adjusting the ratio of the source and gate connections of the bottom electrodes, the Crss may be flexibly adjusted to achieve different design goals for different types of applications.

Briefly in a preferred embodiment this invention discloses a semiconductor power device. The power device has a plurality of power transistor cells each having a trenched gate disposed in a gate trench opened in a semiconductor substrate wherein a plurality of the trenched gates comprising a shielded bottom electrode disposed in a bottom portion of the gate trench electrically insulated from a top gate electrode disposed at a top portion of the gate trench by an inter-electrode insulation layer. At least one of the shielded bottom electrode is connected a source metal and at least one of the top electrodes in the gate trench is electrically connected to a source metal of the power device. In a preferred embodiment, at least one of the shield bottom electrodes is electrically connected to a gate pad of the power device. In another preferred embodiment, at least one of the top electrodes in the gate trench is electrically connected to a gate pad of the power device In another preferred embodiment, the power device further includes an active region and a termination region and said transistor cells in the active region having a source region disposed next to the trenched gate and electrically connected to a source metal disposed on top of the power device. At least one of the gate trenches is filled with a conductive gate material and electrically connected to the source metal.

This invention further discloses method for manufacturing a power device in a semiconductor substrate. The method comprises steps of a) opening a plurality of trenches and filling the trenches with a conductive gate material; b) applying a mask for carrying out a time etch for etching back the conductive gate material from a set of selected trenches thus leaving a bottom portion of the gate conductive material in the selected trenches; c) covering the bottom portion in the selected trenches with a shielding insulation layer to form a bottom shielded electrode followed by filling the selected trenches with the conductive gate material to form top electrodes on top of the shielding insulation layer; and d) wherein the step of forming the plurality of trenches further includes a step form a source runner trench and a gate runner trench extending laterally between an active area and a termination area and further including a step of filling the source runner trench with the conductive gate material to electrically connect at least one of the bottom shielded electrodes to a source metal of the power device. In a preferred embodiment, the method further includes a step of filling the source runner trench with the conductive gate material to electrically connect at least one of the top electrodes to the source metal of the power device In another preferred embodiment, the method further includes a step of filling the gate runner trench with the conductive gate material to electrically connect at least one of the shielded bottom electrodes to a gate pad of the power device In another preferred embodiment, the method further includes a step of filling the gate runner trench with the conductive gate material to electrically connect at least one of the top electrodes to a gate pad of the power device.
Power These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 3A is a top view and FIGS. 3B to 3D are cross sectional views for showing the shielding bottom electrodes in the SGT MOSFET cells electrically connected alternately to the gate and to the source according to structure A as an embodiment of this invention.

FIG. 8A is a top view and FIG. 8B to 8E are cross sectional views showing connections of the electrodes segment in the SGT for structure B of FIG. 5.

FIGS. 9A to 9M are a serial cross sectional views for describing a manufacturing process to provide a trenched MOSFET device as shown in FIG. 5.

DETAILED DESCRIPTION OF THE METHOD

Figure 1:
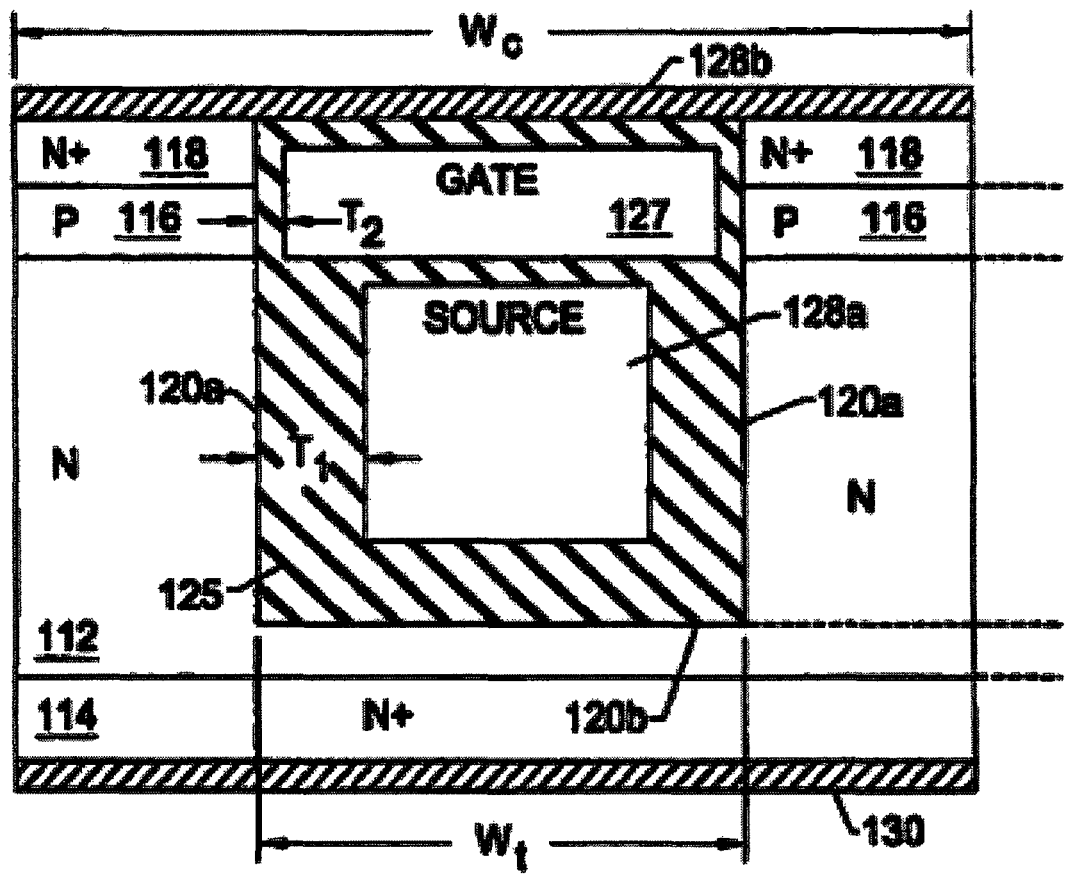
FIG. 1 is a cross sectional view of trenched MOSFET devices disclosed in patented disclosures for reducing gate-drain capacitance.
Figure 2:
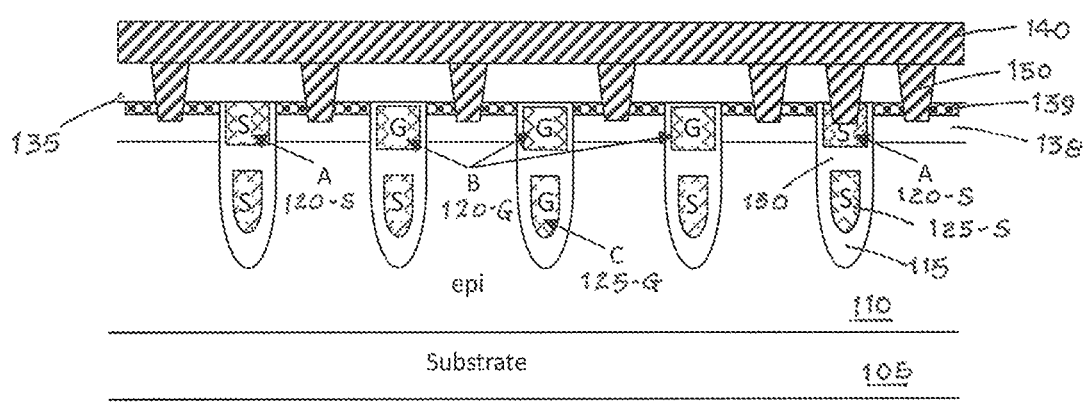
FIG. 2 is a cross sectional view of a trenched MOSFET device implemented with improved configuration of this invention.

Referring to FIG. 2 that shows a cross sectional view of a portion of a shielded gate trench (SGT) MOSFET 100 as an embodiment of this invention. The shielded gate trench (SGT) MOSFET power device 100 as shown is formed in a semiconductor wafer that includes epitaxial layer 110 supported on a heavily doped bottom substrate 105. The epitaxial layer 110 may include one, two or even more doping concentration sublayers. In the active cell area of the device 100 as shown, the device 100 includes a plurality of shield gate trenches 115 padded by a gate oxide layer 118. In each of the shield gate trenches there is a top electrode 120 and bottom electrode 125 shielded by a dielectric layer 130 disposed between the top electrode and the bottom electrode 125. Unlike the conventional shield gate trenches, some of the bottom electrodes 125-S are electrically connected to source and some other bottom electrodes 125-G are electrically connected to gate as that shown in location C in FIG. 2. Furthermore, some of the top electrodes 120-G are electrically connected to gate, shown as locations B, just like the conventional SGT power device while some of the top electrodes 125-S are electrically connected to source as shown in locations A. Specifically, the top layer of the device is covered by an insulation layer 135 and a source metal layer 140 is formed on top of the insulation layer 135. Many source/body contact trenches are opened through the insulation layer 135 to form source/body contacts 150 to contact the source/body regions 139 and 138 of the MOSFET device with some of the source/body contacts 150 formed directly on top of the shield gate trenches to contact the top electrodes 135-S in locations A.

With some of the bottom electrodes 125-G shunted to the gate, the Crss is increased. The flexibilities to adjust the Crss provide a solution to overcome the difficulties of overshoot, gate ringing and EMI issues during the switch operations. These technical difficulties often occur when the Crss is too low. Furthermore, since some of the top electrodes 120-G are connected to the gate, the gate to drain/source capacitance is reduced thus the benefits of lower Ciss is achieved. Additionally, when some of the top electrodes 120-S are connected to the source in locations A, there is no contribution to the Ciss and the a low Ciss is maintained.

The SGT MOSFET device as shown in FIG. 2 can be implemented with different structures. FIG. 3A is a top view of a device structure A. The device as shown includes an active area 200 and a termination area 300 disposed on two opposite sides of the area where a gate runner 160 and source runner 140' are formed. FIGS. 3B to 3D are cross sectional views over the lines of B-B'(D-D'), C-C', E-E', on FIG. 3A. These cross sectional views show the connections of the top and bottom electrodes to the source metal 140, source runner 140' and the gate runner 160. As shown in FIG. 3B, the bottom electrodes are connected to source and the top electrodes are connected to gate. In FIG. 3C, the top and bottom electrodes are all connected to gate while in FIG. 3D, the top and bottom electrodes are all connected to source. The connections of the top and bottom electrodes as shown can therefore be flexibly designed and adjusted.

Figure 4A:
FIGS. 4A to 4M are a serial cross sectional views for describing a manufacturing process to provide a trenched MOSFET device as shown in FIG. 2A.
Figure 4B:
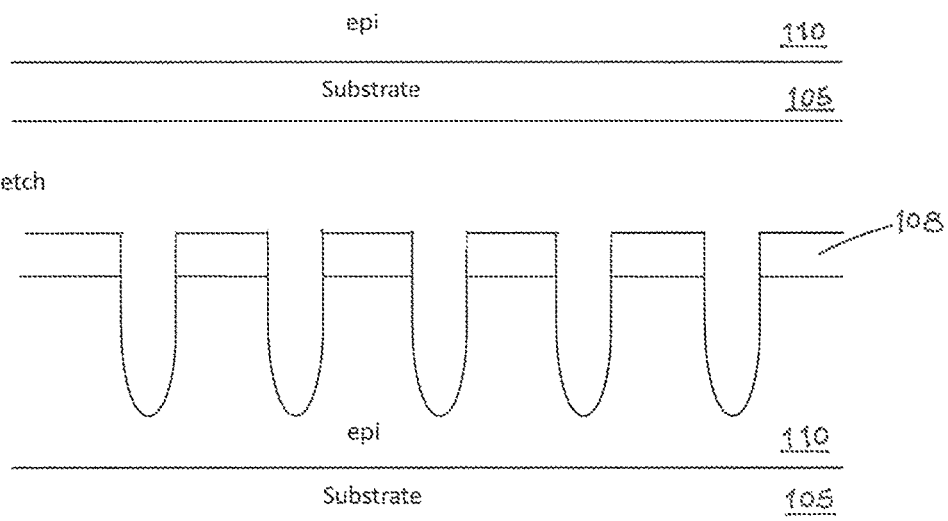
Figure 4C:
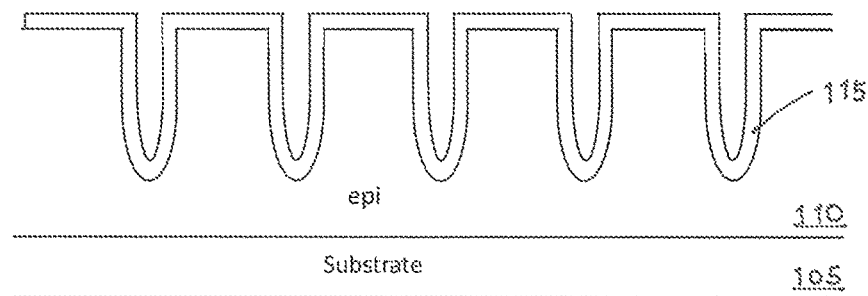

FIGS. 4A-4M are a series of cross sectional views to show the fabrication processes of a MOSFET device shown in FIGS. 3A to 3D as structure A. In FIG. 4A, a hard mask 108 is deposited as first on top of the epitaxial layer 110 supported on the silicon substrate 105. In FIG. 4B, a trench mask (not shown) is applied on top of the hard mask 108 to carry out a trench etch process to open a plurality of trenches in the epitaxial layer 110. In FIG. 4C, the hard mask 108 is removed followed by necessary steps to smooth the trench sidewalls including a sacrificial oxidation and an oxide etch to remove the damaged surface on the trench wall. In FIG. 4C, a shield oxide layer 115 is formed either by thermal oxide or by a SACVD deposition process.

Figure 4D:
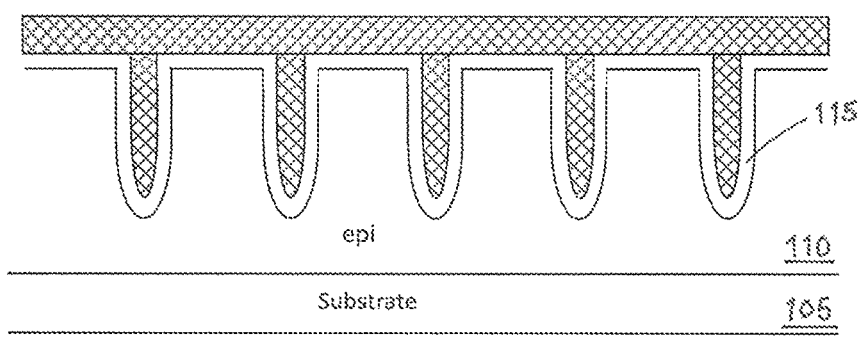
Figure 4E:
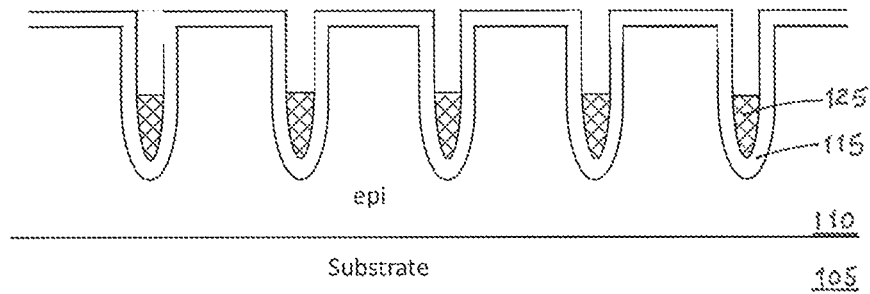
Figure 4F:
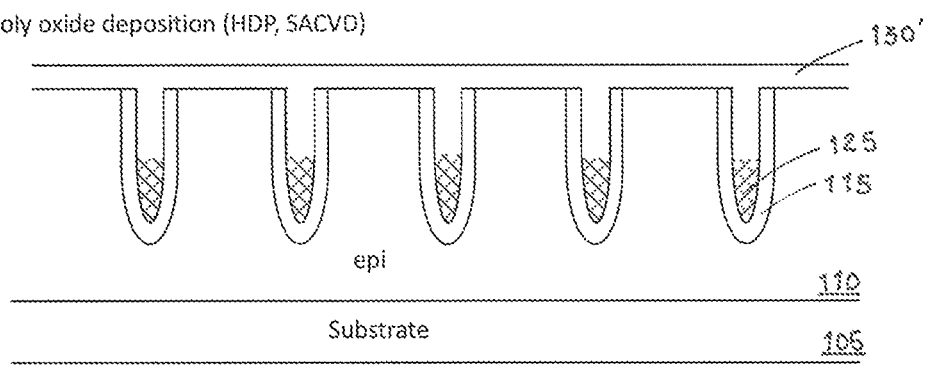
Figure 4G:
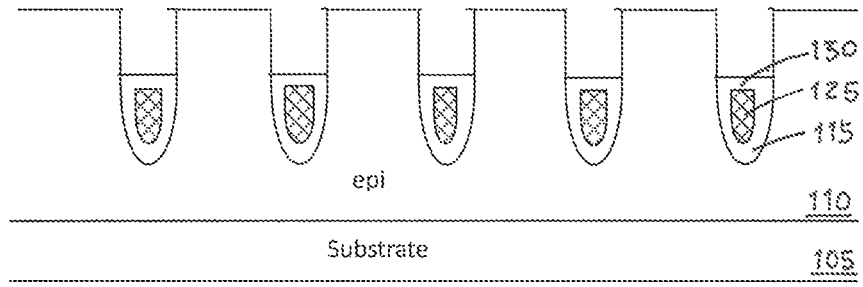

In FIG. 4D, a shield polysilicon layer 125' is deposited into the trenches. In FIG. 4E, a polysilicon etch back is performed to etch back the shield polysilicon layer 125'. In FIG. 4E, the shield polysilicon layer 125' is etched back first without a mask until the top surface of the shield polysilicon is aligned to the Si surface. Then the shield polysilicon in the active area is etched again with a mask until the bottom shield electrodes 120 reaches a certain predesignated depth. In FIG. 4F, an inter-poly oxide deposition is carried out to fill the trench with the inter-poly oxide 130'. In FIG. 4G, an inter-poly oxide etch back is performed to remove the inter-poly oxide 130' from the trenches on top of the bottom electrodes 125 and keep an inter-poly oxide layer 130 covering over the bottom electrodes 125.

Figure 4H:
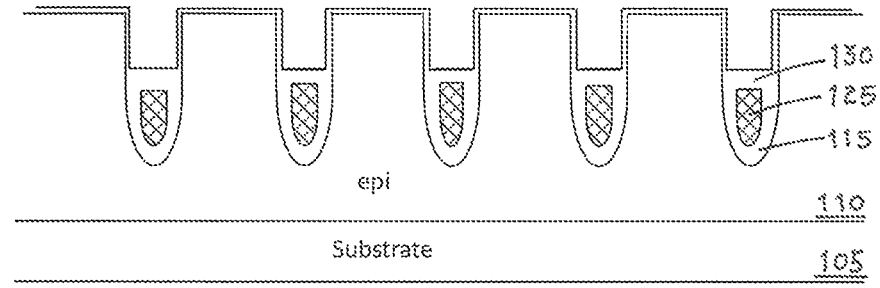
Figure 4I:
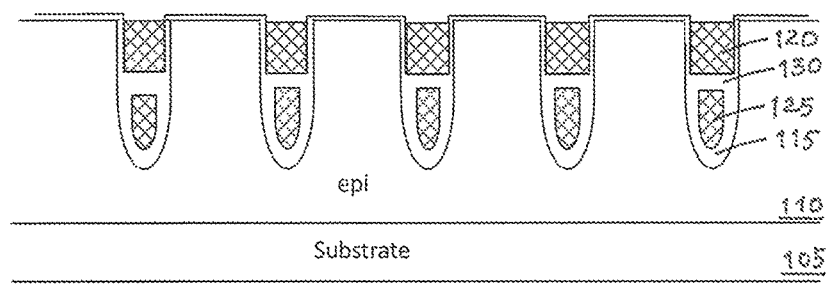
Figure 4J:
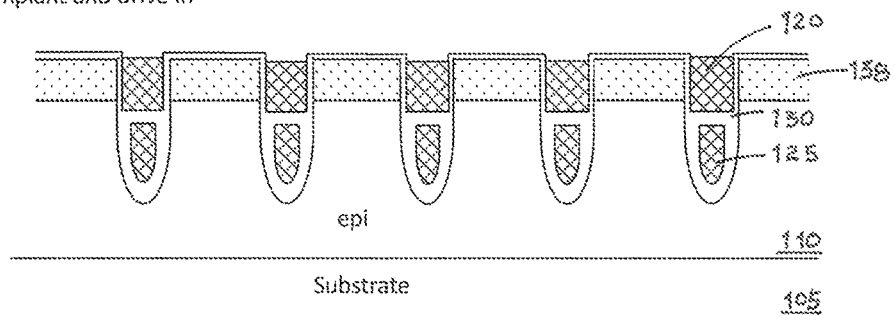
Figure 4K:
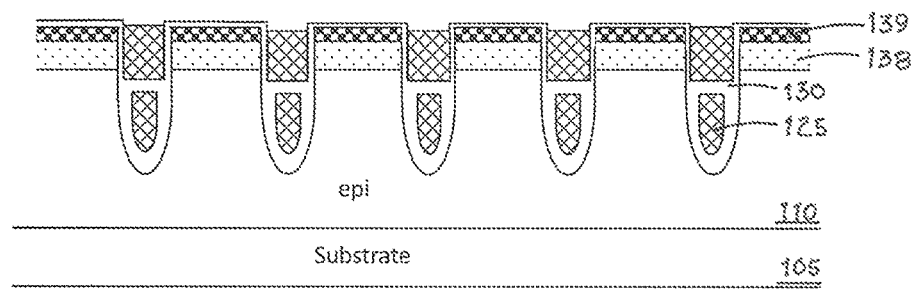

In FIG. 4H, a gate oxide deposition is carried out to form a gate oxide layer on the trench sidewalls above the inter-poly oxide layer 130 followed by the gate polysilicon deposition and etch back processes shown in FIG. 4I to form the top electrodes 120 on top of the inter-poly oxide layer 130 in each of the shield gate trenches. In FIG. 4J, a body implant followed by a drive-in processes are carried out to form the body regions 138 below the top surface of the epitaxial layer 110. In FIG. 4K, a source implant followed by a drive-in processes are carried out to form the source regions 139 encompassed in the body regions 138.

Figure 4L:
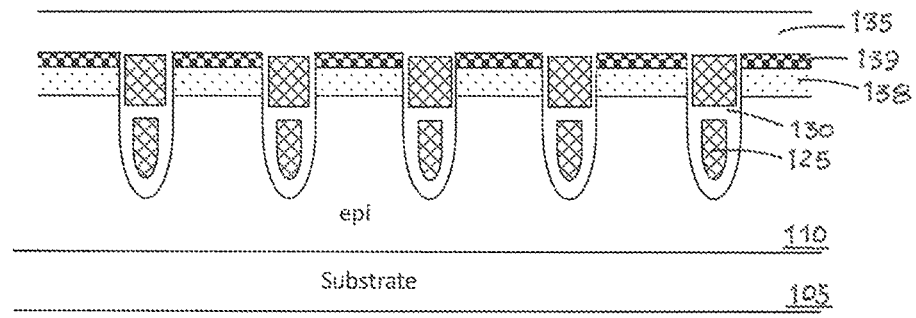
Figure 4M:
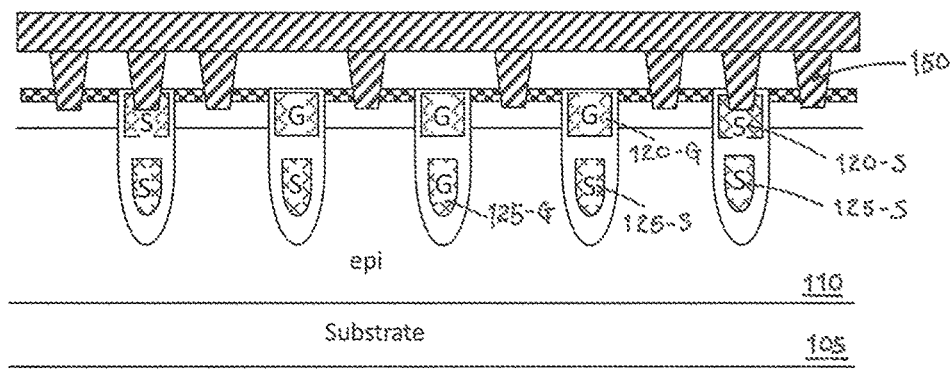

In FIG. 4L, a LTO/BPSG deposition is carried out to form an insulation layer 135 covering over the top surface. In FIG. 4M, a contact trench etch is performed to open contact trench through the passivation/insulation layer 135 followed by filling the contact trench with tungsten plugs 140. Then the processes completed with the deposition and patterning of the top metal layer 140 to function as source metal layer 140 and gate pad 160.

Figure 5:
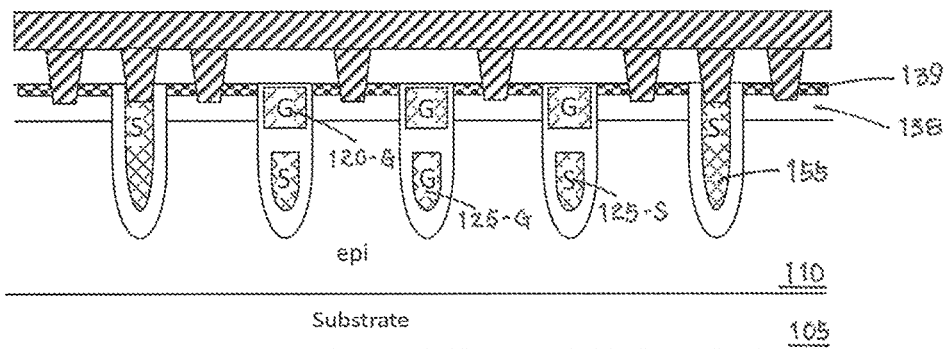
FIGS. 5, 6 and 7 are cross sectional views of three alternate embodiments of this invention.
Figure 6:
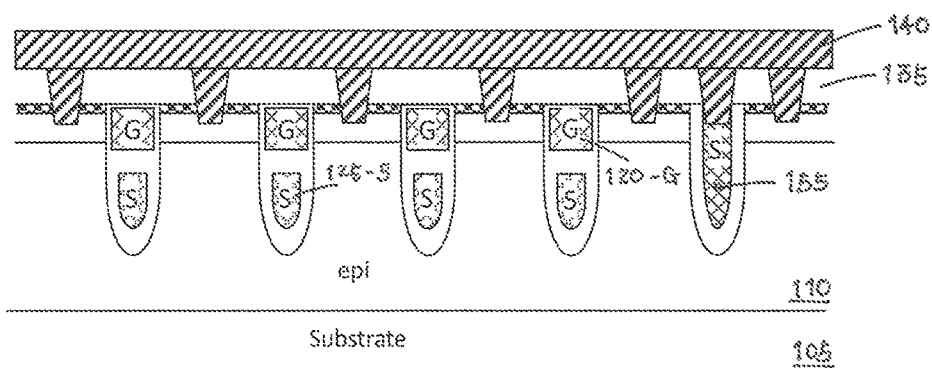
Figure 7:
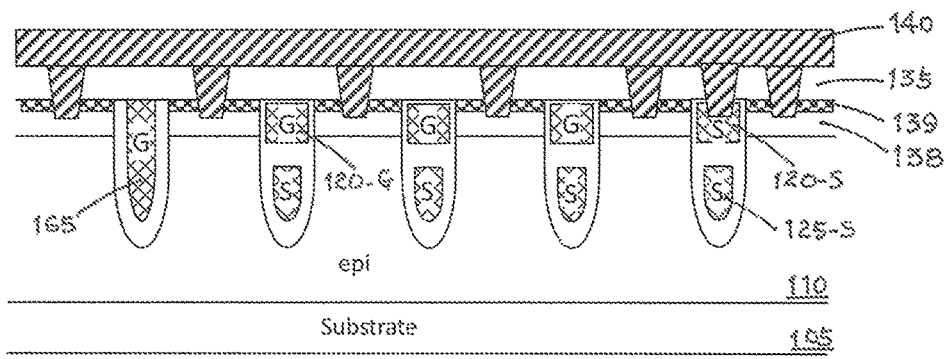

FIGS. 5, 6 and 7 are cross sectional views to show three different embodiments of this invention illustrated as structures B, C and D respectively. In FIG. 5, the structure B configuration includes shield gate trenches include two bottom electrodes 125-S connected to source and one bottom electrode 125-G connected to the gate. All the top electrodes 120-G connected to the gate. Structure B further includes two trenches wherein each trench is filled with a single electrode 155 connected to the source. In FIG. 6, the structure C configuration includes shield gate trenches that have all the bottom electrodes 125-S connected to source and all the top electrodes 120-G connected to the gate. Structure C further includes one trench filled with a single electrode 155 connected to the source. In FIG. 7, the structure D configuration includes shield gate trenches that have all the bottom electrodes 125-S connected to source three top electrodes 120-G connected to the gate and one top electrode 120-S connected to the source. Structure C further includes one trench filled with a single electrode 165 connected to the gate.

Figure 8A:
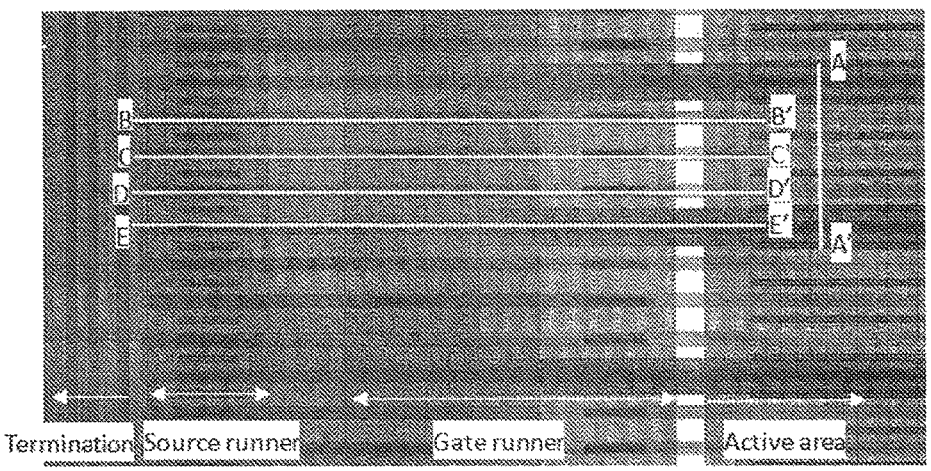
Figure 8A:
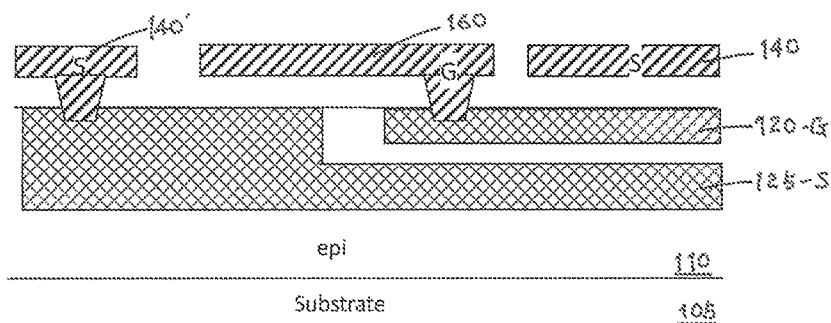
Figure 8A:
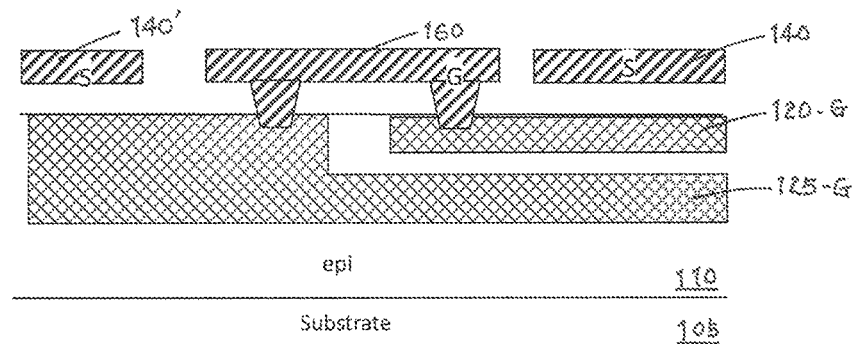
Figure 8A:
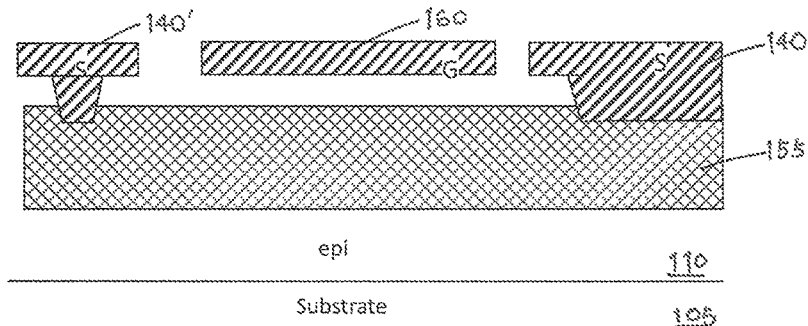

The device shown as structure B in FIG. 5 can be implemented with different layout and configurations. FIG. 8A is a top view of the device structure B. The device as shown includes an active area 200' and a termination area 300' disposed on two opposite sides of the area where a gate runner 160 and source runner 140' are formed. FIGS. 8B to 8E are cross sectional views over the lines of B-B'(D-D'), C-C', E-E' and A-A' respectively on FIG. 8A. These cross sectional views show the connections of the top and bottom electrodes to the source metal 140, source runner 140' and the gate runner 160. As shown in FIG. 8B, the bottom electrodes are connected to source and the top electrodes are connected to gate. In FIG. 8C, the top and bottom electrodes are all connected to gate while in FIG. 8D, the top and bottom electrodes are all connected to source. The connections of the top and bottom electrodes as shown can therefore be flexibly designed and adjusted.

Figure 9E:
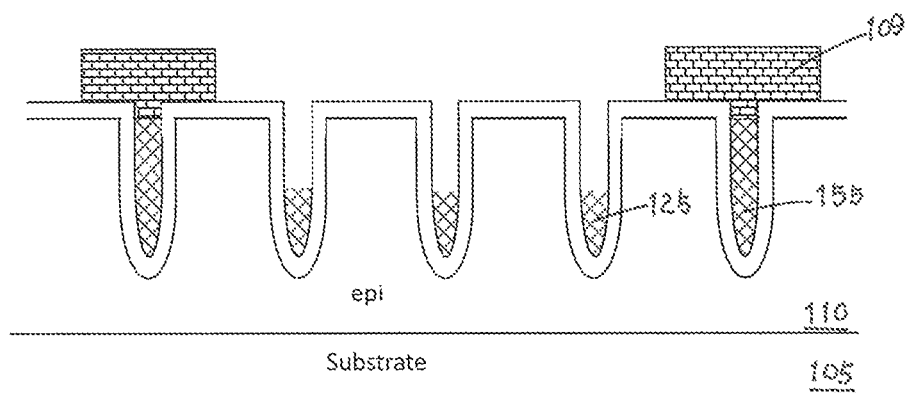

FIGS. 9A-9M are a series of cross sectional views to show the fabrication processes of a MOSFET device shown in FIGS. 8A to 8D as structure B. In FIG. 9A, a hard mask 108 is deposited as first on top of the epitaxial layer 110 supported on the silicon substrate 105. In FIG. 9B, a trench mask (not shown) is applied on top of the hard mask 108 to carry out a trench etch process to open a plurality of trenches in the epitaxial layer 110. In FIG. 9C, the hard mask 108 is removed followed by necessary steps to smooth the trench sidewalls including a sacrificial oxidation and an oxide etch to remove the damaged surface on the trench wall. In FIG. 9C, a shield oxide layer 115 is formed either by thermal oxide or by a SACVD deposition process.

Figure 9F:
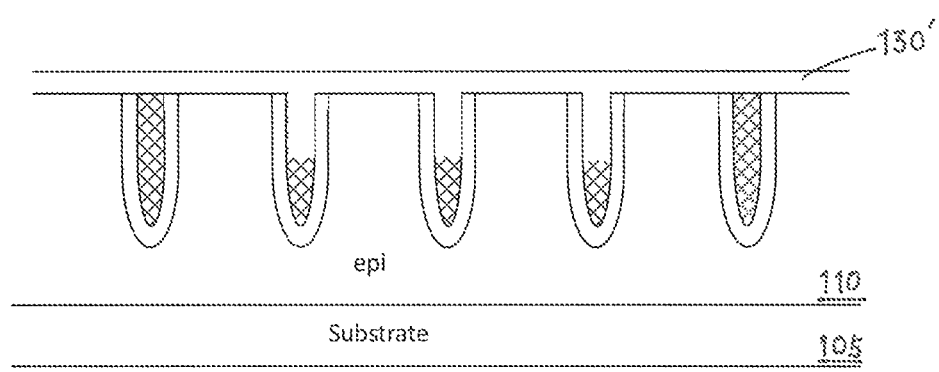
Figure 9G:
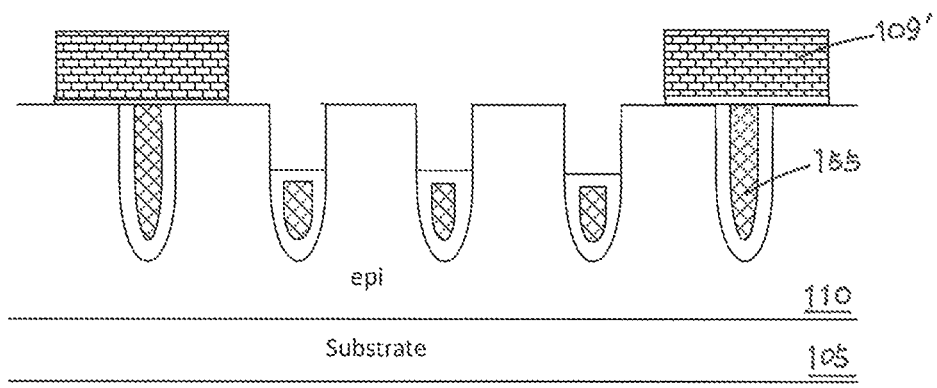

In FIG. 9D, a shield polysilicon layer 125' is deposited into the trenches. In FIG. 9E, a blanket polysilicon etch back is performed to etch back the shield polysilicon layer 125' to remove the shield polysilicon from above the trenches. Then the shield polysilicon layer 125' is etched back with a mask 109 covers selected trenches. The etch-back process continues until the top surface of the bottom shield electrodes 120 reaches a certain predesignated depth. The selected trenches covered with the mask 109 have the entire trench filled with the polysilicon that can function as electrodes to connect to the source later. In FIG. 9F, the mask 109 is removed followed by carrying out an inter-poly oxide deposition to fill the trench with the inter-poly oxide 130'. In FIG. 9G, the selected trenches are covered with a mask 109' and an inter-poly oxide etch back is performed to remove the inter-poly oxide 130' from the trenches on top of the bottom electrodes 125 and keep an inter-poly oxide layer 130 covering over the bottom electrodes 125.

Figure 9H:
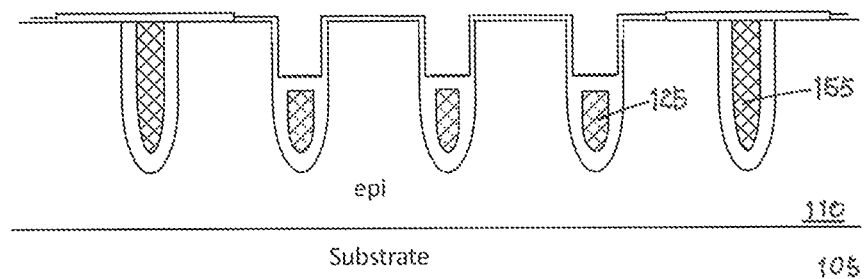
Figure 9I:
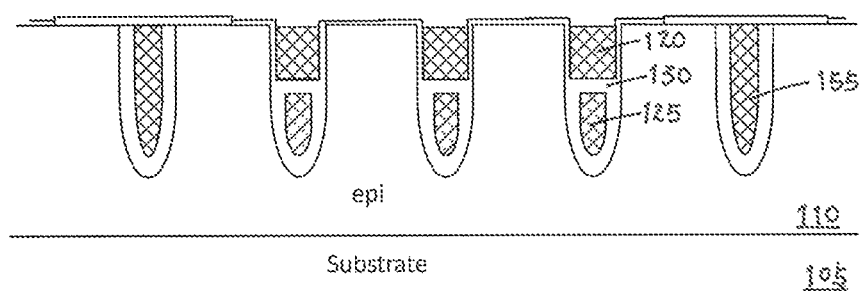
Figure 9J:
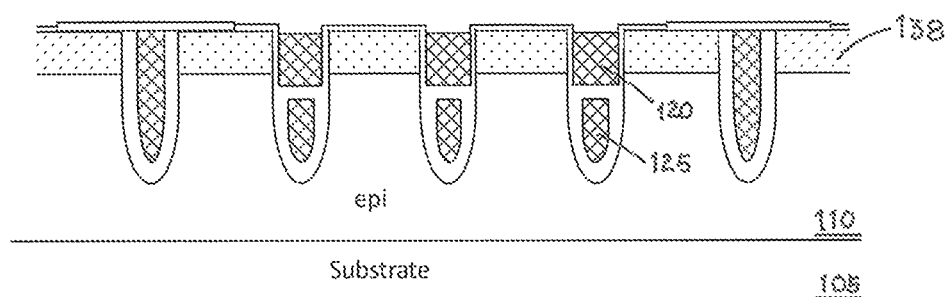
Figure 9K:
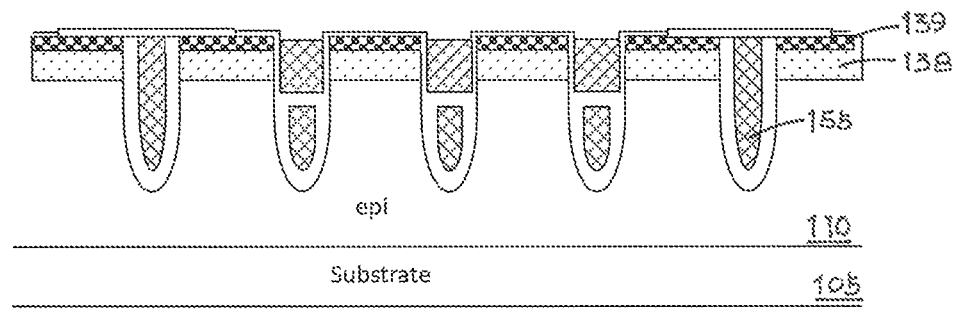

In FIG. 9H, a gate oxide deposition is carried out to form a gate oxide layer on the trench sidewalls above the inter-poly oxide layer 130 followed by the gate polysilicon deposition and etch back processes shown in FIG. 4I to form the top electrodes 120 on top of the inter-poly oxide layer 130 in each of the shield gate trenches. In FIG. 9J, a body implant followed by a drive-in processes are carried out to form the body regions 138 below the top surface of the epitaxial layer 110. In FIG. 9K, a source implant followed by a drive-in processes are carried out to form the source regions 139 encompassed in the body regions 138.

Figure 9L:
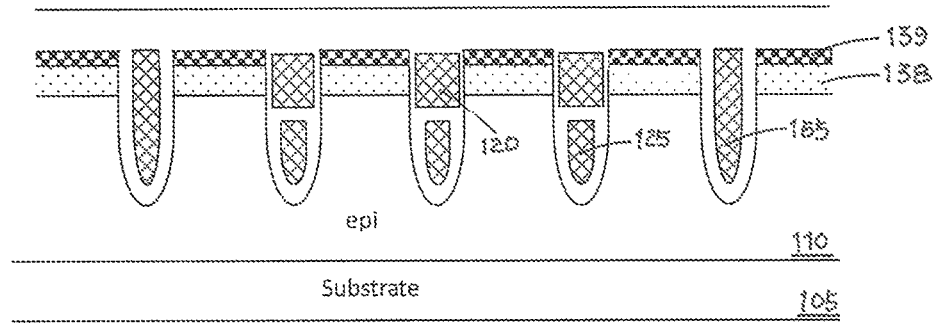
Figure 9M:
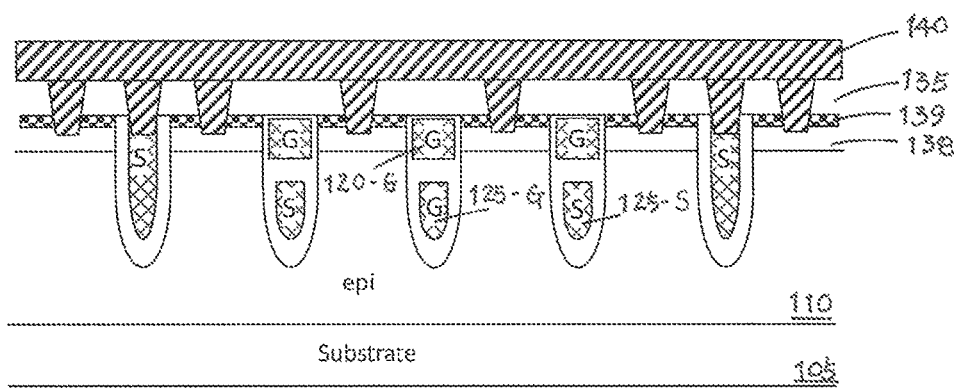

In FIG. 9L, a LTO/BPSG deposition is carried out to form an insulation layer 135 covering over the top surface. In FIG. 9M, a contact trench etch is performed to open contact trench through the passivation/insulation layer 135 followed by filling the contact trench with tungsten plugs 140. Then the processes completed with the deposition and patterning of the top metal layer 140 to function as source metal layer 140 and gate pad 160.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, other conductive material instead of polysilicon may be used to fill the trenches. Accordingly, it is intended that the appended claims be interpreted as covering all alterations and modifications as fall within the true spirit and scope of the invention.

We claim:
1. A semiconductor power device comprising:
a plurality of power transistor cells each having a trenched gate disposed in a trench opened in a semiconductor substrate wherein a plurality of the trenched gates comprising a shielded bottom electrode disposed in a bottom portion of the trench electrically insulated from a top gate electrode disposed at a top portion of the trench by an inter-electrode insulation layer;
at least one of the shielded bottom electrode is connected a source metal and at least one of the top electrodes in the trench is electrically connected to a gate pad of the power device;

at least one of the trenches in an active area filled with a single electrode and is connected to the gate pad; and the device further comprises the active area and a termination area disposed on two opposite sides of the active cell area where a gate runner connected to a gate pad and a source runner connected to a source metal are formed.

2. The semiconductor power device of claim 1 wherein:

at least one of the shield bottom electrodes is electrically connected to the gate pad of the power device.

3. The semiconductor power device of claim 1 wherein:

at least one of the top electrodes in the trench is electrically connected to the gate pad of the power device.

4. The semiconductor power device of claim 1 wherein:

said power device further includes a termination region and said transistor cells in the active region having a source region disposed next to the trenched gate and electrically connected to a source metal disposed on top of the power device; and at least one of the trenches is filled with a conductive gate material and electrically connected to the source metal.

5. The semiconductor power device of claim 1 wherein:

the power device further includes a termination region and the trenches further include a source trench filled with a conductive gate material and extending from the active region to the termination region for electrically connecting the shielded bottom electrode to a source metal disposed in the termination area on top of the power device.

6. The semiconductor power device of claim 4 further comprising:

an insulation layer disposed on top of the power device having a plurality of source contact trenches opened through the insulation layer on top of the source region and filled with a source contact material for electrically connecting the source region to the source metal disposed on top of the insulation layer.

7. The semiconductor power device of claim 2 further comprising:

an insulation layer disposed on top of the power device having a plurality of gate contacting trenches opened through the insulation layer and filled with a gate contact material for electrically connecting the trenched gates to the gate pad disposed on top of the insulation layer.

8. The semiconductor power device of claim 1 wherein:

at least one of said trenches in the active area that is filled with the single electrode electrically connected to the gate runner that is laterally extending from the active area to the termination area for electrically connecting to a gate pad disposed in the termination area.

9. The semiconductor power device of claim 1 wherein:

a percentage of a number of the trenches filled with a conductive gate material over the entire length of the trench relative to a total number of the trenches is between 1% to 50%.

10. The semiconductor power device of claim 1 wherein:

a percentage of a number of the top electrodes electrically connected to the source metal relative to the top electrodes electrically connected to a gate pad is between 1% to 50%.

* * * * *